(12) United States Patent
Kishimoto et al.

(10) Patent No.: US 11,965,049 B2
(45) Date of Patent: Apr. 23, 2024

(54) OPTICAL MEDIUM COMPOSITION WITH NANOSIZED LIGHT EMITTING MATERIAL AND (METH)ACRYLIC POLYMER

(71) Applicant: Merck Patent GmbH, Darmstadt (DE)

(72) Inventors: Tadashi Kishimoto, Kanagawa (JP); Yuko Arai, Kanagawa (JP); Masayoshi Suzuki, Tokyo (JP); Daishi Yokoyama, Kakegawa (JP); Katsuto Taniguchi, Shizuoka (JP)

(73) Assignee: MERCK PATENT GMBH, Darmstadt (DE)

( * ) Notice: Subject to any disclaimer, the term of this patent is extended or adjusted under 35 U.S.C. 154(b) by 608 days.

(21) Appl. No.: 17/265,330

(22) PCT Filed: Jul. 31, 2019

(86) PCT No.: PCT/EP2019/070572
§ 371 (c)(1),
(2) Date: Feb. 2, 2021

(87) PCT Pub. No.: WO2020/025651
PCT Pub. Date: Feb. 6, 2020

(65) Prior Publication Data
US 2021/0317323 A1      Oct. 14, 2021

(30) Foreign Application Priority Data

Aug. 3, 2018 (EP) .................... 18187264

(51) Int. Cl.
| | |
|---|---|
| *C08F 290/12* | (2006.01) |
| *C08F 222/10* | (2006.01) |
| *C09D 4/06* | (2006.01) |
| *C09D 5/22* | (2006.01) |
| *C09D 7/40* | (2018.01) |
| *C09D 7/45* | (2018.01) |
| *C09D 7/61* | (2018.01) |
| *C09D 135/02* | (2006.01) |
| *C09K 11/02* | (2006.01) |
| *C09K 11/08* | (2006.01) |
| *C09K 11/56* | (2006.01) |
| *C09K 11/70* | (2006.01) |
| *C09K 11/88* | (2006.01) |

(52) U.S. Cl.
CPC ............ *C08F 290/126* (2013.01); *C09D 4/06* (2013.01); *C09D 5/22* (2013.01); *C09D 7/45* (2018.01); *C09D 7/61* (2018.01); *C09D 7/67* (2018.01); *C09D 135/02* (2013.01); *C09K 11/02* (2013.01); *C09K 11/0883* (2013.01); *C09K 11/565* (2013.01); *C09K 11/70* (2013.01); *C09K 11/883* (2013.01); *C08F 222/106* (2020.02)

(58) Field of Classification Search
CPC ... C09K 11/02; C09K 11/0883; C09K 11/565; C09K 11/70; C09K 11/883; C08F 290/126; C08F 222/106; C09D 7/61; C09D 7/67; C09D 7/45; C09D 4/06; C09D 5/22; C09D 135/02
See application file for complete search history.

(56) References Cited

U.S. PATENT DOCUMENTS

| | | |
|---|---|---|
| 2010/0129568 A1 | 5/2010 | Kim et al. |
| 2013/0202808 A1 | 8/2013 | Dvorchak et al. |
| 2014/0349129 A1 | 11/2014 | Izumi et al. |
| 2017/0052444 A1* | 2/2017 | Park .................... G02B 5/207 |
| 2018/0046080 A1 | 2/2018 | Suzuki et al. |
| 2018/0051194 A1 | 2/2018 | Palasz |
| 2018/0208841 A1 | 7/2018 | Palazzotto et al. |
| 2018/0284613 A1 | 10/2018 | Hirayama et al. |
| 2018/0346633 A1 | 12/2018 | Hoshino et al. |

FOREIGN PATENT DOCUMENTS

| | | |
|---|---|---|
| CN | 101535438 A | 9/2009 |
| CN | 102906206 A | 1/2013 |
| CN | 104114588 A | 10/2014 |
| CN | 107532042 A | 1/2018 |
| CN | 108139666 A | 6/2018 |
| JP | 109197119 A | 7/1997 |
| WO | 17154907 A1 | 9/2017 |
| WO | 2018093028 A1 | 5/2018 |

OTHER PUBLICATIONS

International Union of Pure and Applied Chemistry, Compendium of Chemical Terminology, Gold Book, Version 2.3.3, Feb. 24, 2012, p. 335 and p. 662.
International Search Report PCT/EP2019/070572 dated Oct. 18, 2019 (pp. 1-4).
Office action in corresponding Chinese Application No. 201980049695.3 dated Feb. 24, 2023 (pp. 1-7) and english translation thereof.
Office Action in corresponding Japanese Patent Application No. 2021-505863 dated Sep. 6, 2023 (1 page).

* cited by examiner

*Primary Examiner* — C Melissa Koslow
(74) *Attorney, Agent, or Firm* — MILLEN, WHITE, ZELANO & BRANIGAN, P.C.; Brion P. Heaney

(57) ABSTRACT

Photosensitive compositions containing nanosized light emitting materials and (meth)acrylic polymer are suitable for use in a variety of optical applications, for example the preparation of quantum material doped photoresist films, especially for optical devices. Optical films can be prepared be by: a) providing the photosensitive composition onto a substrate, and b) polymerizing the photosensitive composition by exposing the photosensitive composition to radiation.

18 Claims, No Drawings

OPTICAL MEDIUM COMPOSITION WITH NANOSIZED LIGHT EMITTING MATERIAL AND (METH)ACRYLIC POLYMER

FIELD OF THE INVENTION

The present invention relates to a composition comprising at least one nanosized light emitting material and a (meth)acrylic polymer. Further, the present invention relates to the use of said (meth)acrylic polymer in a composition, the use of said composition in a process for manufacturing an optical medium and to the use of said optical medium in an optical device. Furthermore, the present invention relates to an optical device comprising the optical medium and methods for preparing the optical medium and the optical device.

BACKGROUND OF THE INVENTION

Photosensitive compositions comprising nanosized light emitting materials, quantum materials or quantum dots are used in a variety of optical applications, for example the preparation of quantum material doped photoresist films, especially for optical devices. Such quantum material doped photoresist films possess a large potential to widen the color gamut of displays and lighting devices and to increase their energy efficiency. However, especially for micro-LED applications, quantum material doped photoresist films which have a high solvent durability and are capable of being patterned at high resolution using conventional photo-lithography techniques are required.

However, due to insufficient polymerization during the photo-curing process such films cannot be easily patterned at high resolution and the cured films exhibit low solvent durability. In particular, because the quantum material embedded in the film largely absorbs the exposed UV light during the curing process, insufficient in-depth photo-polymerization occurs which is mainly responsible for the low resolution of the photo-pattern, and insufficient cross-linking density at the film surface leads to poor resistance to the solvent of overcoated materials applied on the cured film.

Therefore, a need for composition exists, which is capable of improving the resolution of the photo-pattern and the solvent durability of the cured film.

SUMMARY OF THE INVENTION

The present invention was made in view of the problems described above. It is therefore an object of the present invention to provide a composition which can achieve sufficient polymerization even at lower UV exposure doses in order to improve the photo-patterning capability, and which enables formation of highly cross-linked polymer surface so that the solvent durability on the cured film can be improved. Preferably, said composition is a photosensitive composition.

The present inventors have surprisingly found that one or more of the above described problems can be solved by the features as defined in the claims.

Specifically, to solve one or more of the above described problems, the present invention provides a composition comprising at least one nanosized light emitting material and a (meth)acrylic polymer, preferably said composition is a photosensitive composition, wherein the (meth)acrylic polymer comprises at least one structural unit represented by the following chemical formula (1):

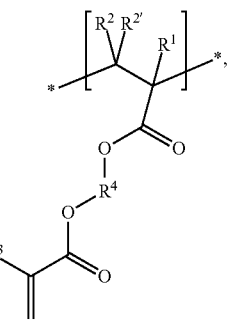

formula (1)

in which:

$R^1$ denotes, identically or differently at each occurrence, hydrogen, a straight-chain alkyl group having 1 to 20 C atoms, a branched or cyclic alkyl group having 3 to 20 C atoms, an alkenyl or alkynyl group having 2 to 20 C atoms, an aryl or heteroaryl group having 5 to 24 C atoms, where one or more non-adjacent methylene structural units (—$CH_2$—) in said alkyl, alkenyl, alkynyl, aryl or heteroaryl groups may in each case be replaced by a sulfonyl group, a carbonyl group, an ether group, a sulfide group, a sulfoxide group, an ester group, an amide group or an imine group, and wherein said alkyl, alkenyl, alkynyl, aryl or heteroaryl groups one or more H atoms may be replaced by F, Cl, Br, I, CN or OH, a carboxyl group (—COOH), a straight-chain alkyl or alkoxy group having 2 to 20 C atoms, a branched alkyl or alkoxy group having 3 to 20 C atoms, or an alkenyl or alkynyl group having 2 to 20 C atoms;

$R^2$, $R^{2'}$ denote, identically or differently at each occurrence, hydrogen, a hydroxyl group (—OH) a carboxyl group (—COOH), a straight-chain alkyl group having 1 to 20 C atoms, a branched or cyclic alkyl group having 3 to 20 C atoms, an alkenyl or alkynyl group having 2 to 20 C atoms, an aryl or heteroaryl group having 5 to 24 C atoms, where one or more non-adjacent methylene structural units (—$CH_2$—) in said alkyl, alkenyl, alkynyl, aryl or heteroaryl groups may in each case be replaced by a sulfonyl group, a carbonyl group, an ether group, a sulfide group, a sulfoxide group, an ester group, an amide group or an imine group, and wherein said alkyl, alkenyl, alkynyl, aryl or heteroaryl groups one or more H atoms may be replaced by F, Cl, Br, I, CN or OH, a carboxyl group (—COOH), a straight-chain alkyl or alkoxy group having 2 to 20 C atoms, a branched alkyl or alkoxy group having 3 to 20 C atoms, or an alkenyl or alkynyl group having 2 to 20 C atoms, with the proviso that both radicals $R^2$ and $R^{2'}$ bonded to the same C atom can denote carboxyl groups at the same time;

$R^3$ denotes, identically or differently at each occurrence, hydrogen, a straight-chain alkyl group having 1 to 20 C atoms, a branched or cyclic alkyl group having 3 to 20 C atoms, an alkenyl or alkynyl group having 2 to 20 C atoms, an aryl or heteroaryl group having 5 to 24 C atoms, where one or more non-adjacent methylene structural units (—$CH_2$—) in said alkyl, alkenyl, alkynyl, aryl or heteroaryl groups may in each case be replaced by a sulfonyl group, a carbonyl group, an ether group, a sulfide group, a sulfoxide group, an ester group, an amide group or an imine group, and wherein said alkyl, alkenyl, alkynyl, aryl or heteroaryl groups one or more H atoms may be replaced by F, Cl, Br, I, CN or OH, a carboxyl group (—COOH), a straight-chain alkyl or alkoxy group having 2 to 20 C atoms, a branched alkyl or alkoxy group having 3 to 20 C atoms, or an alkenyl or alkynyl group having 2 to 20 C atoms;

$R^4$ denotes, identically or differently at each occurrence, a straight-chain alkylene group having 1 to 20 C atoms, a branched alkylene group having 2 to 20 C atoms, an alkenylene or alkynylene group having 2 to 20 C atoms, or an arylene or heteroarylene group having 6 to 24 C atoms, where one or more methylene structural units (—$CH_2$—) in said alkylene, alkenylene, alkynylene, arylene or heteroarylene groups may in each case be replaced by a sulfonyl group, a carbonyl group, an ether group, a sulfide group, a sulfoxide group, an ester group, an amide group, an imine group, a group CHR' or a group CR'R";

R', R" denote, identically or differently at each occurrence, a hydroxyl group, a straight-chain alkyl group having 1 to 20 C atoms, a branched or cyclic alkyl group having 3 to 20 C atoms, an alkenyl or alkynyl group having 2 to 20 C atoms, an aryl or heteroaryl group having 5 to 24 C atoms, where one or more non-adjacent methylene structural units (—$CH_2$—) in said alkyl, alkenyl, alkynyl, aryl or heteroaryl groups may in each case be replaced by a sulfonyl group, a carbonyl group, an ether group, a sulfide group, a sulfoxide group, an ester group, an amide group or an imine group, and wherein said alkyl, alkenyl, alkynyl, aryl or heteroaryl groups one or more H atoms may be replaced by F, Cl, Br, I, CN or OH, a straight-chain alkyl or alkoxy group having 2 to 20 C atoms, a branched alkyl or alkoxy group having 3 to 20 C atoms, or an alkenyl or alkynyl group having 2 to 20 C atoms.

The present inventors have surprisingly found that the composition according to the present invention can be sufficiently polymerized for preparation of photoresist composite films even at low UV exposure doses of, for example, about 80 mJ/cm$^2$, which is acceptable for mass production processes, making it possible that such films can be easily patterned at high resolution, for example in the range of 10 µm, and to manufacture an optical medium, such as an optical film or patterned film, at low cost. Due to the low UV doses, quantum materials in the photoresist composite film do not get significantly damaged during UV exposure, so that the quantum materials can maintain high quantum yield in an optical medium. Furthermore, the present inventors have surprisingly found that the photosensitive composition according to the present invention exhibits a high crosslinking density at the film surface so that a highly crosslinked polymer surface can be formed, which leads to a high solvent durability of the photoresist composite film, particularly when an overcoat material is applied to the film, and to a high chemical resistance, which in particular prevents peeling-off of the photo-cured area during alkali development process.

Further, to solve one or more of the above described problems the present invention provides for a use of a (meth)acrylic polymer which comprises at least one structural unit represented by the chemical formula (1) in a composition that comprises at least one nanosized light emitting material, preferably said composition is a photosensitive composition.

The present invention further provides for a method for preparing an optical film, wherein the method comprises the following steps a) and b) in this sequence: a) providing the composition onto a substrate, and b) polymerizing the composition by exposing the composition under radiation.

In a preferred embodiment, said composition is a photosensitive composition.

The present invention also relates to an optical medium formed from the composition, preferably from the photosensitive composition of the present invention.

Further, the present invention relates to a use of the optical medium in an optical device.

Further, the present invention relates to an optical device comprising the optical medium and to a method for preparing the optical device, wherein the method comprises the step of providing the optical medium in an optical device.

Further advantages of the present invention will become evident from the following detailed description.

DETAILED DESCRIPTION OF THE INVENTION

Hereinafter, the best mode for carrying out the present invention is described in detail.

As used herein, an asterisk ("*" or "*") is generally used to denote a linkage to an adjacent unit or group, including for example, in case of a polymer, to an adjacent repeating or constitutional unit, or to another group, for example a side chain in case of a monomeric compound.

As used herein, the term "photosensitive" or "photoreactive" means that the respective composition chemically reacts in response to suitable light irradiation. The light is usually chosen from visible or UV light. The photosensitive response includes hardening or softening of the composition, preferably hardening.

For the purposes of the present application the term "copolymer" is used to denote a polymer derived from more than one species of monomer (see also International Union of Pure and Applied Chemistry, Compendium of Chemical Terminology, Gold Book, Version 2.3.3, 2012 Feb. 24, page 335). For the purposes of the present application the term "monomer" is used to denote a substance composed of monomer molecules, and the term "monomer molecule" is used to denote a molecule which can undergo polymerization thereby contributing one or more constitutional units to the essential structure of a macromolecule or polymer (see also International Union of Pure and Applied Chemistry, Compendium of Chemical Terminology, Gold Book, Version 2.3.3, 2012 Feb. 24, page 662).

According to the present invention, a composition, preferably a photosensitive composition, comprising at least one nanosized light emitting material and a (meth)acrylic polymer is provided to solve the object of the present invention as described above.

As used herein, the term "(meth)acrylic polymer" means a general term of polymer obtained by polymerization of monomers selected from the group consisting of acrylic acid, methacrylic acid, acrylate, methacrylate, and a combination of any of these.

The (meth)acrylic polymer comprises at least one (meth)acrylic structural unit including an acryloyl group as represented by the following chemical formula (1):

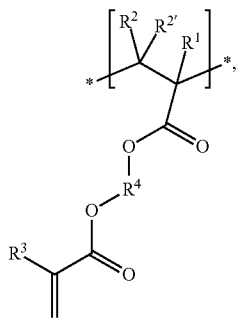

formula (1)

in which:

$R^1$ denotes, identically or differently at each occurrence, hydrogen, a straight-chain alkyl group having 1 to 20 C atoms, a branched or cyclic alkyl group having 3 to 20 C atoms, an alkenyl or alkynyl group having 2 to 20 C atoms, an aryl or heteroaryl group having 5 to 24 C atoms, where one or more non-adjacent methylene structural units (—$CH_2$—) in said alkyl, alkenyl, alkynyl, aryl or heteroaryl groups may in each case be replaced by a sulfonyl group, a carbonyl group, an ether group, a sulfide group, a sulfoxide group, an ester group, an amide group or an imine group, and wherein said alkyl, alkenyl, alkynyl, aryl or heteroaryl groups one or more H atoms may be replaced by F, Cl, Br, I, CN or OH, a carboxyl group (—COOH), a straight-chain alkyl or alkoxy group having 2 to 20 C atoms, a branched alkyl or alkoxy group having 3 to 20 C atoms, or an alkenyl or alkynyl group having 2 to 20 C atoms;

$R^2$, $R^{2'}$ denote, identically or differently at each occurrence, hydrogen, a hydroxyl group (—OH) a carboxyl group (—COOH), a straight-chain alkyl group having 1 to 20 C atoms, a branched or cyclic alkyl group having 3 to 20 C atoms, an alkenyl or alkynyl group having 2 to 20 C atoms, an aryl or heteroaryl group having 5 to 24 C atoms, where one or more non-adjacent methylene structural units (—$CH_2$—) in said alkyl, alkenyl, alkynyl, aryl or heteroaryl groups may in each case be replaced by a sulfonyl group, a carbonyl group, an ether group, a sulfide group, a sulfoxide group, an ester group, an amide group or an imine group, and wherein said alkyl, alkenyl, alkynyl, aryl or heteroaryl groups one or more H atoms may be replaced by F, Cl, Br, I, CN or OH, a carboxyl group (—COOH), a straight-chain alkyl or alkoxy group having 2 to 20 C atoms, a branched alkyl or alkoxy group having 3 to 20 C atoms, or an alkenyl or alkynyl group having 2 to 20 C atoms, with the proviso that both radicals $R^2$ and $R^{2'}$ bonded to the same C atom can denote carboxyl groups at the same time;

$R^3$ denotes, identically or differently at each occurrence, hydrogen, a straight-chain alkyl group having 1 to 20 C atoms, a branched or cyclic alkyl group having 3 to 20 C atoms, an alkenyl or alkynyl group having 2 to 20 C atoms, an aryl or heteroaryl group having 5 to 24 C atoms, where one or more non-adjacent methylene structural units (—$CH_2$—) in said alkyl, alkenyl, alkynyl, aryl or heteroaryl groups may in each case be replaced by a sulfonyl group, a carbonyl group, an ether group, a sulfide group, a sulfoxide group, an ester group, an amide group or an imine group, and wherein said alkyl, alkenyl, alkynyl, aryl or heteroaryl groups one or more H atoms may be replaced by F, Cl, Br, I, CN or OH, a carboxyl group (—COOH), a straight-chain alkyl or alkoxy group having 2 to 20 C atoms, a branched alkyl or alkoxy group having 3 to 20 C atoms, or an alkenyl or alkynyl group having 2 to 20 C atoms;

$R^4$ denotes, identically or differently at each occurrence, a straight-chain alkylene group having 1 to 20 C atoms, a branched alkylene group having 2 to 20 C atoms, an alkenylene or alkynylene group having 2 to 20 C atoms, or an arylene or heteroarylene group having 6 to 24 C atoms, where one or more methylene structural units (—$CH_2$—) in said alkylene, alkenylene, alkynylene, arylene or heteroarylene groups may in each case be replaced by a sulfonyl group, a carbonyl group, an ether group, a sulfide group, a sulfoxide group, an ester group, an amide group, an imine group, a group CHR' or a group CR'R";

R', R" denote, identically or differently at each occurrence, a hydroxyl group, a straight-chain alkyl group having 1 to 20 C atoms, a branched or cyclic alkyl group having 3 to 20 C atoms, an alkenyl or alkynyl group having 2 to 20 C atoms, an aryl or heteroaryl group having 5 to 24 C atoms, where one or more non-adjacent methylene structural units (—$CH_2$—) in said alkyl, alkenyl, alkynyl, aryl or heteroaryl groups may in each case be replaced by a sulfonyl group, a carbonyl group, an ether group, a sulfide group, a sulfoxide group, an ester group, an amide group or an imine group, and wherein said alkyl, alkenyl, alkynyl, aryl or heteroaryl groups one or more H atoms may be replaced by F, Cl, Br, I, CN or OH, a straight-chain alkyl or alkoxy group having 2 to 20 C atoms, a branched alkyl or alkoxy group having 3 to 20 C atoms, or an alkenyl or alkynyl group having 2 to 20 C atoms.

As used herein, the term "cyclic alkyl group" is understood to include monocyclic alkyl groups, polycyclic alkyl groups such as bicyclic alkyl groups, and combinations of cyclic and straight-chain or branched alkyl groups.

As used herein, the term "aryl group" is a substituent derived from an aromatic hydrocarbon, such as phenyl, and is understood to also include "arylalkyl groups", which term is understood to mean aryl groups to which an alkyl group is bonded.

As used herein, the term "heteroaryl group" is understood to mean an aryl group that has at least one carbon atom replaced by one of heteroatoms O, N or S.

As used herein, the term "arylene group" is a substituent that is derived from an aromatic hydrocarbon (arene) that has a hydrogen atom removed from two ring carbon atoms, such as phenylene. The term "arylene group" is understood to also include "arylalkylene groups" which term is understood to mean an arylalkyl group as defined above that has a hydrogen atom removed from two carbon atoms, no matter if chain or ring carbon atoms. Accordingly, a "heteroarylene group" is a substituent that is derived from a heteroaryl group as defined above that has a hydrogen atom removed from two ring atoms and is understood to also include heteroarylene groups to which an alkyl group is bonded.

Preferably, in chemical formula (1) radical $R^1$ denotes hydrogen, a straight-chain alkyl group having 1 to 10 C atoms, or a branched alkyl group having 3 to 10 C atoms. More preferably, radical $R^1$ denotes hydrogen or a methyl group.

Further preferably, in chemical formula (1) radical $R^{2'}$ denotes hydrogen or a methyl group and radical $R^2$ denotes hydrogen, a carboxyl group, a straight-chain alkyl group having 1 to 8 C atoms, wherein one or more H atoms may be replaced by F, Cl, OH, or a carboxyl group (—COOH). Even more preferably radical $R^{2'}$ denotes hydrogen and radical $R^2$ denotes a methyl group or a carboxyl group.

Further preferably, in chemical formula (1) radical $R^3$ denotes hydrogen, a straight-chain alkyl group having 1 to 10 C atoms, or a branched alkyl group having 3 to 10 C atoms. More preferably, radical $R^3$ denotes hydrogen or a methyl group.

Further preferably, in chemical formula (1) radical $R^4$ denotes a straight-chain alkylene group having 1 to 10 C atoms, a branched alkylene group having 2 to 10 C atoms, an alkenylene group having 2 to 10 C atoms, or an arylene group having 6 to 10 C atoms, where one or more non-adjacent methylene structural units (—$CH_2$—) in said alkylene alkenylene or arylene groups may be replaced by a sulfonyl group, a carbonyl group, an ether group, a sulfide group, a sulfoxide group, an ester group, an amide group, an imine group, a group CHR' or a group CR'R''; wherein R', R'' have the same meaning as defined above. Even more preferably, radical $R^4$ denotes a straight-chain alkylene group having 1 to 6 C atoms, an alkenylene group having 2 to 6 C atoms or an arylene group having 6 C atoms.

Preferably R', R'' denote, identically or differently at each occurrence, a hydroxyl group, a straight-chain alkyl group having 1 to 10 C atoms, a branched alkyl group having 3 to 10 C atoms, an alkenyl or alkynyl group having 2 to 10 C atoms, an aryl group having 6 to 10 C atoms, where one or more non-adjacent methylene structural units (—$CH_2$—) in said alkyl, alkenyl, alkynyl or aryl groups may in each case be replaced by a sulfonyl group, a carbonyl group, an ether group, a sulfide group, a sulfoxide group, an ester group, an amide group or an imine group,
and wherein said alkyl, alkenyl, alkynyl or aryl groups one or more H atoms may be replaced by F, Cl, Br, I, CN or OH.

Most preferably, radical $R^1$ denotes hydrogen or a methyl group, radical $R^{2'}$ denotes hydrogen, radical $R^2$ denotes hydrogen, a carboxyl group or a methyl group, radical $R^3$ denotes hydrogen or a methyl group and radical $R^4$ denotes a methylene group or a straight-chain alkylene group having 2 to 6 C atoms.

Without wishing to be bound by theory, it is believed that due to the (meth)acrylic polymer which comprises at least one (meth)acrylic structural unit including an acryloyl group as represented by chemical formula (1) the number of (photo)reactive sites is increased so that sufficient polymerization of the photosensitive composition can be achieved. Thus, the composition ratio of the (meth)acrylic polymer can be decreased while keeping sufficient polymerization. Therefore, a higher loading of quantum materials into the photosensitive composition can be realized in order to achieve high OD.

It is further preferred according to the present invention, if the (meth)acrylic polymer further comprises one or more structural units selected from the following chemical formulae (2), (3) and (4):

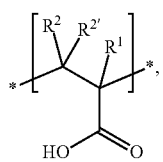

formula (2)

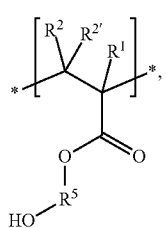

formula (3)

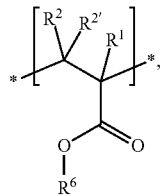

formula (4)

in which radicals $R^1$, $R^2$ and $R^{2'}$ are at each occurrence, identically or differently, as defined above with respect to chemical formula (1);
$R^5$ denotes, identically or differently at each occurrence, a straight-chain alkylene group having 1 to 20 C atoms, a branched alkylene group having 2 to 20 C atoms, an alkenylene or alkynylene group having 2 to 20 C atoms, or an arylene or heteroarylene group having 6 to 24 C atoms, where one or more methylene structural units (—$CH_2$—) in said alkylene, alkenylene, alkynylene, arylene or heteroarylene groups may in each case be replaced by a sulfonyl group, a carbonyl group, an ether group, a sulfide group, a sulfoxide group, an ester group, an amide group, an imine group, a group CHR' or a group CR'R'', wherein radicals R' and R'' are as defined above; and
$R^6$ denotes, identically or differently at each occurrence, a straight-chain alkyl group having 1 to 20 C atoms, a branched alkyl group having 3 to 20 C atoms, or a cyclic alkyl group having 3 to 20 C atoms.

More preferably, in chemical formula (3) radical $R^5$ denotes a straight-chain alkylene group having 1 to 10 C atoms, a branched alkylene group having 2 to 10 C atoms, or an alkenylene group having 2 to 10 C atoms, where one or more non-adjacent methylene structural units (—$CH_2$—) in said alkylene or alkenylene groups may be replaced by a sulfonyl group, a carbonyl group, an ether group, a sulfide group, a sulfoxide group, an ester group, an amide group, an imine group, a group CHR' or a group CR'R'', wherein radicals R' and R'' are as defined above. Even more preferably, radical $R^5$ denotes a straight-chain alkylene group having 1 to 6 C atoms, where one or more non-adjacent methylene structural units (—$CH_2$—) in said alkylene group may be replaced by a group CHR' or a group CR'R'', wherein R' and R'' denote, identically or differently at each occurrence, a hydroxyl group, a straight-chain alkyl group having 1 to 6 C atoms or a branched alkyl group having 3 to 6 C atoms,
wherein said alkyl, groups one or more H atoms may be replaced by F, Cl, or OH.

Furthermore preferably, in chemical formula (4) radical $R^6$ denotes a straight-chain alkyl group having 1 to 10 C atoms, a branched alkyl group having 3 to 10 C atoms, or a cyclic alkyl group having 6 C atoms. Even more preferably, radical $R^6$ denotes a straight-chain alkyl group having 2 to 8 C atoms.

This means, according to the present invention it is preferred if the (meth)acrylic polymer comprising at least one (meth)acrylic structural unit including an acryloyl group (corresponding to chemical formula (1) above) is a copolymer that additionally comprises one or more (meth)acrylic structural units including an carboxyl group (corresponding to chemical formula (2) above) and/or one or more (meth)acrylic structural unit(s) including an hydroxyl group (corresponding to chemical formula (3) above) and/or one or more (meth)acrylic structural unit(s) including an alkyl ester group (corresponding to chemical formula (4) above).

It is particularly preferred according to the present invention if the (meth)acrylic polymer comprising at least one (meth)acrylic structural unit including an acryloyl group additionally comprises one or more (meth)acrylic structural units including a carboxyl group, one or more (meth)acrylic structural unit(s) including a hydroxyl group and one or more (meth)acrylic structural unit(s) including an alkyl ester group, each group being as defined herein.

The (meth)acrylic polymer is preferably a copolymer obtained by polymerization of different monomers.

The meth)acrylic structural units including the carboxyl group fill the role of dissolving the polymer in an alkali developer and are preferably derived from an unsaturated carboxylic. Examples of the unsaturated carboxylic acid for forming the meth)acrylic structural units including the carboxyl group include: (meth)acrylic acid, maleic acid, fumaric acid, crotonic acid, itaconic acid, citraconic acid, mesaconic acid, and cinnamic acid. It is also possible to use mixtures of those unsaturated carboxylic acids. Among the above, (meth)acrylic acid is particularly preferred.

The number of (meth)acrylic structural units including a carboxyl group is not particularly limited. The content of this structural unit in the polymer is preferably between 3 and 50 wt. %, more preferably between 5 and 30 wt. %. Within this range the solubility of the polymer in the area where the polymer is intended to dissolve in the alkali developer is increased. In order to reconcile better reactivity and storage stability of the photosensitive composition, the acid value of the (meth)acrylic polymer is preferably in the range from 10 to 200 mg KOH/g. More preferably, it is from 15 mg KOH/g to 150 mg KOH/g.

The (meth)acrylic structural units including the hydroxyl group fill the role of forming a crosslinking structure, which gives properties of mechanical strength and the like to the polymer. These structural units are preferably derived from hydroxyl-containing unsaturated monomers such as: 2-hydroxyethyl (meth)acrylate, 4-hydroxybutyl (meth)acrylate, 5-hydroxypentyl (meth)acrylate, 6-hydroxyhexyl (meth)acrylate, or 8-hydroxyoctyl (meth)acrylate; 2-hydroxypropyl (meth)acrylate, 2-hydroxybutyl (meth)acrylate, 2-hydroxypropyl-3-phenoxypropyl (meth)acrylate, or 3-chloro-2-hydroxypropyl (meth)acrylate; and a tertiary hydroxyl-containing monomer, such as, 2,2-dimethyl-2-hydroxyethyl (meth)acrylate; diethylene glycol (meth)acrylate or glycerol (meth)acrylate. The content of the (meth)acrylic structural unit including the hydroxyl group in the polymer is preferably 3 wt. % or more so that the polymer can have the properties of mechanical strength and the like, but preferably 40 wt. % or less so as not to impair the storage stability. The (meth)acrylic structural unit including the hydroxyl group is particularly preferably contained in an amount of 5 to 35 wt. %.

The (meth)acrylic structural units including the alkyl ester group also give properties of mechanical strength and the like to the polymer. These structural units are preferably derived from unsaturated carboxylic acid ester monomers such as: methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, n-pentyl (meth)acrylate, isopentyl (meth)acrylate, neopentyl (meth)acrylate n-hexyl (meth)acrylate, isohexyl (meth)acrylate, n-heptyl (meth)acrylate, isoheptyl (meth)acrylate, n-octyl (meth)acrylate, isooctyl (meth)acrylate, n-nonyl (meth)acrylate, isononyl (meth)acrylate, n-decyl (meth)acrylate, isodecyl (meth)acrylate, 2-ethylhexyl (meth)acrylate, lauryl (meth)acrylate or cyclohexyl (meth)acrylate.

The content of the (meth)acrylic structural unit including the alkylester group in the polymer is preferably 3 wt. % or more so that the polymer can have the properties of mechanical strength and the like, but preferably 40 wt. % or less so as not to impair the storage stability. The (meth)acrylic structural unit including the alkylester group is particularly preferably contained in an amount of 5 to 35 wt. %.

Other polymerization units fill the role of forming the main skeleton of the polymer so that the polymer can have properties of mechanical strength and the like. Those polymerization units are derived from copolymerizable monomers, which are not particularly limited. Examples of the copolymerizable monomers include: aromatic vinyl compounds, such as, styrene, a-methylstyrene, tert-butylstyrene, o-vinyltoluene, m-vinyltoluene, p-vinyltoluene, p-chlorotoluene, o-methoxystyrene, m-methoxystyrene, p-methoxystyrene, o-vinyibenzyl methyl ether, m-vinylbenzyl methyl ether, p-vinylbenzyl methyl ether, o-vinylbenzyl glycidyl ether, m-vinylbenzyl glycidyl ether, and p-vinylbenzyl glycidyl ether; and unsaturated carboxylic acid esters, such as, tridecyl lauryl (meth)acrylate, cetyl lauryl (meth)acrylate, n-stearyl lauryl (meth)acrylate, i-stearyl lauryl (meth)acrylate, phenyl (meth)acrylate, tetrahydrofurfuryl (meth)acrylate, isobornyl (meth)acrylate, 2-methyl-2-adamantyl (meth)acrylate, 2-ethyl-2-adamantyl (meth)acrylate, 2-isopropyl-2-adamantyt (meth)acrylate, 2-methoxyethyl (meth)acrylate, 2-phenoxyethyl (meth)acrylate, diethylene glycol monomethyl ether (meth)acrylate, triethylene glycol monomethyl ether (meth)acrylate, propylene glycol monomethyl ether (meth)acrylate, dipropylene glycol monomethyl ether (meth)acrylate, isobornyl (meth)acrylate, 2-hydroxy-3-phenoxy propyl (meth)acrylate, 2-aminoethyl (meth)acrylate, 2-dimethylaminoethyl (meth)acrylate, 2-aminopropyl (meth)acrylate, 2-dimethylaminopropyl (meth)acrylate, 3-aminoethyl (meth)acrylate, 3-dimethylaminoethyl (meth)acrylate, glycidyl (meth)acrylate, 2,2,2-trifluoroethyl (meth)acrylate, 2,2,3,3-tetrafluoropropyl (meth)acrylate, 2,2,3,3,3-pentafluoropropyl (meth)acrylate, 2,2,3,4,4,4-hexafluorobutyl (meth)acrylate, 2-(perfluorobutyl)ethyl (meth)acrylate, 3-perftuorobutyl-2-hydroxypropyl (meth)acrylate, 2-(perfluorohexyl)ethyl (meth)acrylate, 3-perfluorohexyl-2-hydroxyl-propyl (meth)acrylate, IH,IH,3H-tetrafluoropropyl (meth)acrylate, IH,IH,5H-octafluoropentyl (meth)acrylate, IH,IH,7H-dodecafluoroheptyl (meth)acrylate, and perfluorooctylethyl (meth)acrylate.

The content of other polymerization units in the polymer is preferably 40 wt. % or more so that the polymer can have the properties of mechanical strength and the like, but preferably 90 wt. % or less so that the polymer can surely contain the indispensable constituents.

According to the present invention, the weight-average molecular weight (Mw) of the (meth)acrylic polymer is not particularly limited. Preferably, the weight-average molecular weight of the (meth)acrylic polymer is in the range from 2000 to 100000, more preferably from 3000 to 30000, and even more preferably from 4000 to 20000. Here, the "weight-average molecular weight" means a polystyrene-reduced weight average molecular weight determined by gel permission chromatography (GPC).

Further preferably, according to the present invention, the equivalent amount of the (meth)acrylic structural unit including an acryloyl group in the (meth)acrylic polymer is in the range from 400 to 560, more preferably from 440 to 520, furthermore preferably 480. As used herein, the term "equivalent amount" should be understood to mean the molecular weight/number n of structural units including an acryloyl group (unit: g/eq) and indicates the "molecular weight per one structural unit including an acryloyl group".

By changing the equivalent amount of (meth)acrylic structural unit including an acryloyl group in the (meth) acrylic polymer, (photo)reactivity of the (meth)acrylic polymer can be adjusted as desired.

Nanosized Light Emitting Materials

According to the present invention, as an inorganic part of the semiconducting nanosized light emitting material a wide variety of publicly known semiconducting nanosized light emitting materials can be used as desired.

A type of shape of the nanosized light emitting material of the present invention is not particularly limited. Any type of nanosized light emitting materials, for examples, spherical shaped, elongated shaped, star shaped, polyhedron shaped semiconducting light emitting nanoparticles, can be used.

In a preferred embodiment of the present invention, the nanosized light emitting material can be selected from the group consisting of nanosized inorganic phosphor materials, quantum sized materials, such as quantum dots and or quantum rods, and a combination of any of these.

More preferably, the nanosized light emitting material is a quantum sized material, with furthermore preferably being of a quantum dot material, quantum rod material or a combination of any of these.

According to the present invention, the term "nanosized" means the size in the range from 0.1 to and 999 nm, preferably from 0.1 nm to 150 nm. Thus, according to the present invention, the nanosized light emitting material is taken to mean a light emitting material which size of the overall diameter is in the range from 0.1 nm to 999 nm, preferably from 0.1 nm to 150 nm. And in case of the material has elongated shape, the length of the overall structures of the fluorescent material is in the range from 0.1 nm to 999 nm, preferably from 0.1 nm to 150 nm.

As used herein, the term "quantum sized" means the size of the semiconducting light emitting material itself without ligands or any other surface modification, which can show the quantum confinement effect, like described in, for example, ISBN:978-3-662-44822-9. Generally, it is said that quantum sized materials such as quantum dot material and/or quantum rod material can emit tunable, sharp and vivid colored light due to "quantum confinement" effect.

Preferably, the size of the overall structure of the quantum sized material is from 1 nm to 100 nm, more preferably, it is from 1 nm to 30 nm, even more preferably, it is from 5 nm to 15 nm.

As a quantum dot, publicly available quantum dot, for examples, CdSeS/ZnS alloyed quantum dots product number 753793, 753777, 753785, 753807, 753750, 753742, 753769, 753866, InP/ZnS quantum dots product number 776769, 776750, 776793, 776777, 776785, PbS core-type quantum dots product number 747017, 747025, 747076, 747084, or CdSe/ZnS alloyed quantum dots product number 754226, 748021, 694592, 694657, 694649, 694630, 694622 from Sigma-Aldrich, can be used preferably as desired.

In another preferred embodiment of the present invention, the nanosized light emitting material is a semiconducting light emitting nanoparticle having a core-shell-structure, wherein a core is surrounded by one or more shell layers.

According to the present invention, said one or more shell layers of the semiconducting light emitting nanoparticle is preferably a single shell layer, a double shell layer, or multishell layers having more than two shell layers, most preferably it is a double shell layer.

As used herein, the term "shell layer" means the structure covering fully or partially said core. Preferably, said one or more shell layers fully covers said core. The terms "core" and "shell" are well known in the art and typically used in the field of quantum materials, such as U.S. Pat. No. 8,221,651 B2. According to the present invention, said core of the semiconducting light emitting nanoparticle can vary. For example, CdS, CdSe, CdTe, ZnS, ZnSe, ZnSeS, ZnTe, ZnO, GaAs, GaP, GaSb, HgS, HgSe, HgSe, HgTe, InAs, InP, InPS, InPZnS, InPZn, InPGa, InSb, AlAs, AlP, AlSb, Cu$_2$S, Cu$_2$Se, CuInS$_2$, CuInSe$_2$, Cu$_2$(ZnSn)S$_4$, Cu$_2$(InGa)S$_4$, TiO$_2$ alloys and a combination of any of these can be used.

In a preferred embodiment of the present invention, said core of the semiconducting light emitting nanoparticle comprises one or more of group 13 elements of the periodic table and one or more of group 15 elements of the periodic table. For example, GaAs, GaP, GaSb, InAs, InP, InPS, InPZnS, InPZn, InPGa, InSb, AlAs, AlP, AlSb, CuInS$_2$, CuInSe$_2$, Cu$_2$(InGa)S$_4$, and a combination of any of these.

Even more preferably, the core comprises In and P atoms, for example, InP, InPS, InPZnS, InPZn or InPGa.

According to a further preferred embodiment of the present invention, said at least one of the shell layers comprises a 1$^{st}$ element of group 12, 13 or 14 of the periodic table and a 2$^{nd}$ element of group 15 or 16 of the periodic table. Preferably, all shall layers comprises a 1$^{st}$ element of group 12, 13 or 14 of the periodic table and a 2$^{nd}$ element of group 15 or 16 of the periodic table.

More preferably, at least one of the shell layers comprises a 1st element of group 12 of the periodic table and a 2$^{nd}$ element of group 16 of the periodic table. For example, CdS, CdZnS, ZnS, ZnSe, ZnSSe, ZnSSeTe, CdS/ZnS, ZnSe/ZnS or ZnS/ZnSe shell layers can be used. Even more preferably, all shall layers comprises a 1st element of group 12 of the periodic table and a 2$^{nd}$ element of group 16 of the periodic table.

Particularly preferably, at least one shell layer is represented by following formula (5), $$ZnS_xSe_yTe_z, \qquad \text{formula (5)},$$

in which 0≤x≤1, 0≤z≤1, 0≤z≤1, and x+y+z=1, with 0≤x≤1, 0≤y≤1, z=0, and x+y=1 being even more preferred.

ZnS, ZnSe, ZnSeS, ZnSeSTe, CdS/ZnS, ZnSe/ZnS, ZnS/ZnSe shell layers are most preferably used.

It is further preferred that all shell layers are represented by formula (5). For example, as a core-shell semiconducting light emitting nanoparticle for green and/or red emission use, CdSe/CdS, CdSeS/CdZnS, CdSeS/CdS/ZnS, ZnSe/CdS, CdSe/ZnS, InP/ZnS, InP/ZnSe, InP/ZnSe/ZnS, InP/ZnS/ZnSe, InPZn/ZnS, InPZn/ZnSe/ZnS, InPZn/ZnS/ZnSe, ZnSe/CdS, ZnSe/ZnS semiconducting light emitting nanoparticle or combination of any of these, can be used.

More preferably, InP/ZnS, InP/ZnSe, InP/ZnSe/ZnS, InP/ZnS/ZnSe, InPZn/ZnS, InPZn/ZnSe/ZnS, InPZn/ZnS/ZnSe can be used.

In a preferred embodiment of the present invention, said shell layers of the semiconducting light emitting nanoparticle are double shell layers.

Said semiconducting light emitting nanoparticles are publicly available, for example, from Sigma-Aldrich and/or described in, for example, *ACS Nano*, 2016, 10 (6), pp 5769-5781, Chem. Mater. 2015, 27, 4893-4898, and the international patent application No. WO 2010/095140 A2.

Preferably, the nanosized light emitting material such as quantum rod and/or quantum dot comprises a surface ligand. The surface of the quantum rod and/or quantum dot materials can be over coated with one or more kinds of surface ligands.

Without wishing to be bound by theory it is believed that such surface ligands may lead to disperse the nanosized fluorescent material in a solvent more easily. A wetting and dispersing agent can be attached onto the surface of the ligand of the nanosized fluorescent material or directly attached onto the surface of the nanosized fluorescent material partially or fully by using ligand exchange process as described in—Wetting and dispersing agents below.

According to the present invention, preferably, the photosensitive composition is a green type photosensitive composition containing the plurality of the green visible light emittable nanosized light emitting materials, red type photosensitive composition comprising the plurality of the red visible light emittable nanosized light emitting materials, or white type photosensitive composition containing the plurality of the different kinds of nanosized light emitting materials, such as the mixture of the green visible light emittable nanosized light emitting materials and the red light emittable nanosized light emitting materials.

Photo-Polymerization Initiator

According to an embodiment of the present invention, the photosensitive composition preferably further comprises a polymerization initiator and thus serves as a negative-type photosensitive composition. The polymerization initiator used in the present invention is preferably a photo-polymerization initiator. In general, a photo-polymerization initiator or photo-initiator, which terms are used interchangeably herein, is a kind of polymerization initiator which generates an acid, base, or radical when exposed to radiation.

The polymerization initiator adoptable in the present is, for example, a photo acid-generator, which decomposes when exposed to radiation and releases an acid serving as an active substance for photo-curing the composition; a photo radical-generator, which releases a radical; or a photo base-generator, which releases a base. Examples of the radiation include visible light, UV rays, IR rays, X-rays, electron beams, a-rays and y-rays. It is particularly preferred to use a photo radical-generator.

The optimal amount of the polymerization initiator depends on the kind of the active substance released from the decomposed initiator, on the amount of the released substance, on the required sensitivity and on the dissolution contrast between the exposed and unexposed areas.

In a preferred embodiment of the present invention, the amount of the polymerization initiator is in the range from 0.001 to 10 weight parts, more preferably 0.01 to 5 weight parts, based on 100 weight parts of the (meth)acrylic polymer. More than 0.001 weight part is preferable to realize the better dissolution contrast between the exposed and unexposed areas and to obtain the effect of the initiator. On the other hand, less than 10 weight parts of the polymerization initiator is preferable to prevent cracks of the fabricated color conversion film, or coloring of the fabricated film caused by decomposition of the initiator and to realize good resistance of the coating against a photoresist remover.

Examples of the above photo acid-generator include diazomethane compounds, diphenyliodonium salts, triphenylsulfonium salts, sulfonium salts, ammonium salts, phosphonium salts and sulfonamide compounds. The structures of those photo acid-generators can be represented by the formula (A):

R+X− (A),

In which R+ is hydrogen or an organic ion modified by carbon atoms or other hetero atoms provided that the organic ion is selected from the group consisting of alkyl groups, aryl groups, alkenyl groups, acyl groups and alkoxy groups. For example, R+ is diphenyliodonium ion or triphenylsulfonium ion.

Further, X− is preferably a counter ion represented by any of the following formulas:

SbYe−, AsYe−, $R^a_p PY_{6-p}^-$, $R^a_q BY_{4-q}^-$, $R^a_q GaY_{4-q}^-$, $RaSO_3^-$, $(RaSO_2)_3C^-$, $RaCOO^-$, and $SCN^-$, in which Y is a halogen atom, $R^a$ is an alkyl group of 1 to 20 carbon atoms or an aryl group of 6 to 20 carbon atoms provided that each group is substituted with a substituent group selected from the group consisting of fluorine, nitro group and cyano group, $R^b$ is hydrogen or an alkyl group of 1 to 8 carbon atoms, p is a number of 0 to 6, and q is a number of 0 to 4.5

Concrete examples of the counter ion include: $BF_4^-$, $(C_6F_6)_4B^-$, $((CF_3)_2C_6H_3)_4B^-$, $PF_6^-$, $(CF_3CF_2)_3PF_3^-$, $SbF_6^-$, $(C_6F_6)_4Ga^-$, $((CF_3)_2C_6H_3)_4Ga^-$, $SCN^-$, $(CF_3SO_2)_3C^-$, $(CF_3SO_2)_2N^-$, formate ion, acetate ion, trifluoromethanesulfonate ion, nonafluorobutanesulfonate ion, methanesulfonate ion, butanesulfonate ion, benzenesulfonate ion, p-toluenesulfonate ion, and sulfonate ion.

Among the photo acid-generators usable in the present invention, those generating sulfonic acids or boric acids are particularly preferred. Examples thereof include tricumyliodonium tetrakis(pentafluorophenyl)-borate (PHOTOINITIATOR2074 [trademark], manufactured by Rhodorsil), diphenyliodonium tetra(perfluorophenyl)borate, and a compound having sulfonium ion and pentafluoroborate ion as the cation and anion moieties, respectively. Further, examples of the photo acid-generators also include triphenylsulfonium trifluoromethanesulfonate, triphenylsulfonium camphorsulfonate, triphenylsulfonium tetra(perfluorophenyl)borate, 4-acetoxyphenyldimethylsulfonium hexafluoroarsenate, 1-(4-n-butoxynaphthalene-1-yl)tetrahydrothiophenium trifluoro-methanesulfonate, 1-(4,7-dibutoxy-1-naphthalenyl)tetrahydrothiophenium trifluoro-methanesulfonate, diphenyliodonium trifluoromethanesulfonate, and diphenyliodonium hexafluoroarsenate. Furthermore, it is still also possible to adopt photo acid-generators represented by the following formulas:

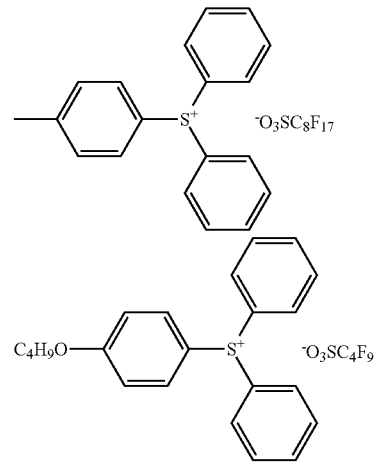

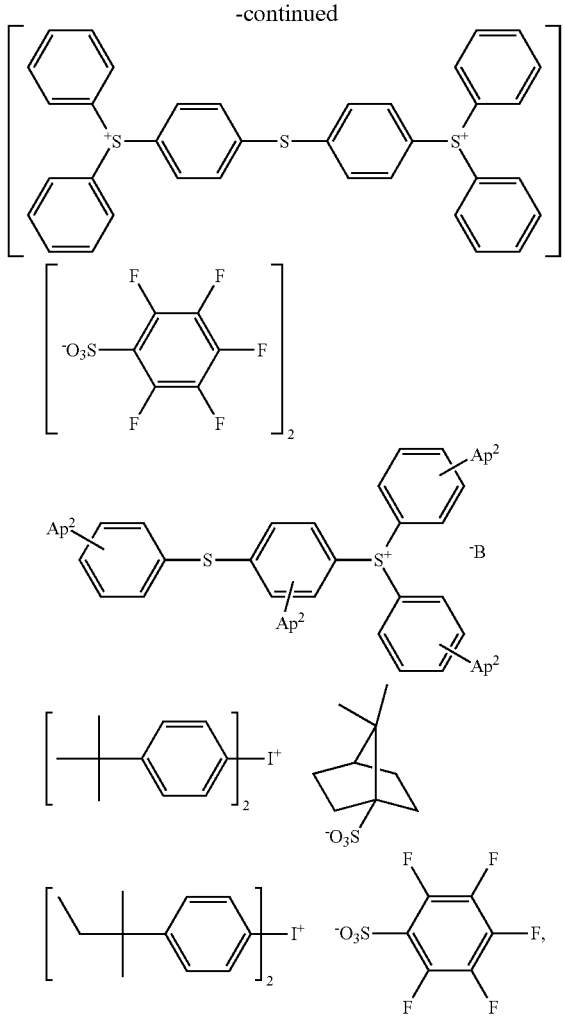

in which
each A is independently a substituent group selected from the group consisting of an alkyl group of 1 to 20 carbon atoms, an alkoxy group of 1 to 20 carbon atoms, an aryl group of 6 to 20 carbon atoms, an alkylcarbonyl group of 1 to 20 carbon atoms, an arylcarbonyl group of 6 to 20 carbon atoms, hydroxyl group, and amino group;
each p is independently an integer of 0 to 5; and
B⁻ is a fluorinated alkylsulfonate group, a fluorinated arylsulfonate group, a fluorinated alkylborate group, an alkylsulfonate group or an arylsulfonate group.

It is also possible to use photo acid-generators in which the cations and anions in the above formulas are exchanged each other or combined with various other cations and anions described above. For example, any one of the sulfonium ions represented by the above formulas can be combined with tetra(perfluorophenyl)borate ion, and also any one of the iodonium ions represented by the above formulas can be combined with tetra(per-fluorophenyl)borate ion. Those can be still also employed as the photo acid-generators.

Examples of the photo radical-generator include azo compounds, peroxides, acyl phosphine oxides, alkyl phenones, oxime esters, and titanocenes. According to the present invention, as the photo radical-generator, acyl phosphine oxides, alkyl phenones, oxime esters, or a combination of any of these are more preferable. Examples of the preferred initiators include: 2,2-dimethxye-1,2-diphenylethane-1-on, 1-hydroxy-cyclohexylphenylketone, 2-hydroxy-2-methyl-1-phenylpropan-1-on, 1-[4-(2-hydroxyethoxy)phenyl]-2-hydroxy-2-methyl-1-propane-1-on, 2-hydroxy-1-{4[4-(2-hydroxy-2-methylpropionyl)benzyl]phenyl}-2-methylpropane-1-on, 2-methyl-1-(4-methylthiophenyl)-2-morpholinopropane-1-on, 2-benzyl-2-dimethylamino-1-(4-morpholinophenyl)-1-butanone, 2-(dimethylamino)-2-[(4-methylphenon)methyl]-1-[4-(4-morpholinyl)phenyl]-1-butanone, 2,4,6-trimethylbenzoyl-diphenylphosphine oxide, bis(2,4,6-trimethylbenzoyl)phenylphosphine oxide, 1,2-octanedione 1-[4-(phenylthio)-2-(o-benzoyl oxime)], ethanone 1[9-ethyl-6-(2-methylbenzoyl)-9H-carbazole-3-yl]-1-(o-acetyl oxime) or a combination of any of these can be used preferably. Particularly preferable, as the photo radical-generator oxime esters, such as 1,2-octanedione 1-[4-(phenylthio)-2-(o-benzoyl oxime)], ethanone 1-[9-ethyl-6-(2-methylbenzoyl)-9H-carbazole-3-yl]-1-(o-acetyl oxime) (available as Irgacure® Oxe01 and Irgacure® Oxe02, respectively, manufactured by BASF) or Irgacure® Oxe03 (manufactured by BASF), or a combination of any of these are used.

Examples of the photo base-generator include multi-substituted amide compounds having amide groups, lactams, imide compounds, and compounds having those structures. Examples of the above heat base-generator include: imidazole derivatives, such as, N-(2-nitrobenzyloxycarbonyl)imidazole, N-(3-nitrobenzyloxycarbonyl)imidazole, N-(4-nitrobenzyloxycarbonyl)imidazole, N-(5-methyl-2-nitrobenzyloxycarbonyl)imidazole, and N-(4-chloro-2-nitro-benzyloxycarbonyl)imidazole; 1,8-diazabicyclo(5,4,0)undecene-7, tertiary amines, quaternary ammonium salts, and mixture thereof. Those base-generators as well as the acid-generators and/or radical-generators can be used singly or in mixture.

According to an embodiment of the present invention, a polymerization initiator generating an acid, base, or radical when exposed to radiation may be used.

Thus, in a preferred embodiment of the present invention, the polymerization initiator can be selected from the group consisting of a photo radical-generator, photo base-generator, photo acid-generator, and a combination of any of these.

More preferably, the polymerization initiator is a photo radical-generator, and most preferably an oxime ester. Preferred examples of oxime ester photo radical-generator are listed above.

Dispersing and Wetting Agent

It is further preferred according to the present invention, if the composition further comprises a wetting and dispersing agent, which preferably comprise an anchoring group selected from phosphine groups, phosphine oxide groups, phosphate groups, phosphonate groups, thiol groups, tertiary amine groups, carboxyl groups, hetero cyclic groups, silane groups, sulfonic acids, hydroxyl groups, and phosphonic acids. Examples of such preferred wetting and dispersing agent are disclosed, for example, in WO 2017/054898 A1.

In a preferred embodiment of the present invention, the anchoring group of the wetting and dispersing agent can be selected from the group consisting of tertiary amine, phosphine oxide groups, phosphonic acids, and phosphate groups.

More preferably, to prevent dark reaction, the anchoring group can be a tertiary amine represented by following chemical formula (6).

$$-NR_{11}R_{21} \qquad \text{formula (6)}$$

wherein $R_{11}$ is a hydrogen atom, alkyl group having 1 to 30 carbon atoms, or an aryl group having 1 to 30 carbon atoms; $R_{22}$ is a hydrogen atom, alkyl group having 1 to 30 carbon atoms, or an aryl group having 1 to 30 carbon atoms; $R_{11}$ and $R_{21}$ can be the same or different of each other.

Even more preferably, $R_{11}$ is an alkyl group having 1 to 30 carbon atoms; $R_{21}$ is an alkyl group having 1 to 30 carbon atoms; $R_{11}$ and $R_{21}$ can be the same or different of each other.

Furthermore preferably, $R_{11}$ is methyl group, ethyl group, n-propyl group, or n-butyl group; $R_{21}$ is methyl group, ethyl group, n-propyl group, or n-butyl group.

In a further preferred embodiment of the present invention, the wetting and dispersing agent is a copolymer selected from the group consisting of graft copolymers, block copolymers, alternating copolymers, and random copolymers.

More preferably, the copolymer comprises polymer unit A including the anchoring group as defined above, and polymer unit B that does not include any one of the anchoring group.

Even more preferably, the copolymer is a block copolymer or a graft copolymer represented by following chemical formula (7) or (8):

$$A_n\text{-}B_m \qquad \text{formula (7)}$$

$$B_o\text{-}A_n\text{-}B_m \qquad \text{formula (8)}$$

where in the formulae (7) and (8) the symbol "A" represents polymer unit A including the anchoring group; the symbol "B" represents the polymer unit B that does not include any one of the anchoring group; and each of symbols "n", "m", and "o" is an integer.

Preferably, the polymer unit B of the wetting and dispersing agent comprises a polymer chain selected from the group consisting of polyethylene glycols, polyester, polylactic acids, polyvinyl alcohols, polyvinylpyrrolidones, celluloses and derivatives of any of these. More preferably, the polymer chain of the polymer unit B is a polyethylene glycol.

According to the present invention, the weight-average molecular weight of the wetting and dispersing agent is not particularly limited. Preferably, it is in the range from 2,000-100,000, more preferably, it is in the range from 5,000-30,000 from the view point of better dispersivity and film strength. According to the present invention, the molecular weight Mw is determined by means of GPC (=gel permeation chromatography) against an internal polystyrene standard.

Solvent

According to a further embodiment of the present invention, the composition may further comprise a solvent.

According to the present invention, a wide variety of publicly known solvents may be used preferably. There are no particular restrictions on the solvent as long as it can homogeneously dissolve or disperse the above a (meth) acrylic polymer, the polymerization initiator, and the additives incorporated optionally.

In a preferred embodiment of the present invention, the solvent can be selected from the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; aromatic hydrocarbons, such as, benzene, toluene and xylene; ketones, such as, methyl ethyl ketone, acetone, methyl amyl ketone, methyl isobutyl ketone, and cyclohexanone; alcohols, such as, ethanol, propanol, butanol, hexanol, cyclohexanol, ethylene glycol, and glycerin; esters, such as, ethyl 3-ethoxypropionate, methyl 3-methoxypropionate and ethyl lactate; and cyclic asters, such as, y-butyrolactone. Those solvents are used singly or in combination of two or more, and the amount thereof depends on the coating method and the thickness of the coating.

More preferably, propylene glycol alkyl ether acetates, such as, propylene glycol monomethyl ether acetate (hereafter "PGMEA"), propylene glycol monoethyl ether acetate, or propylene glycol monopropyl ether acetate are used. Even more preferably, PGMEA is used.

The amount of the solvent in the composition can be freely controlled according to the method of coating the composition. For example, if the composition is to be spray-coated, it can contain the solvent in an amount of 90 wt. % or more. Further, if a slit-coating method, which is often adopted in coating a large substrate, is to be carried out, the content of the solvent is normally 60 wt. % or more, preferably 70 wt. % or more.

Chemical Compound Including Two or More of (Meth) Acryloyl Groups

According to a preferred embodiment of the present invention, the composition, preferably the photosensitive composition, may further comprise a chemical compound including two or more of (meth)acryloyl groups.

According to the present invention, the term "(meth) acryloyl group" means a general term of acryloyl group and methacryloyl group.

The chemical compound including two or more of (meth) acryloyl groups can react with the (meth)acrylic polymer to create a crosslinking structure. Preferably, the chemical compound comprises more than three or even four of (meth)acryloyl groups to create a higher dimension crosslinking structure together with the (meth)acrylic polymer.

As examples of the chemical compound including two or more of (meth)acryloyl groups, esters formed by reacting of a polyol and two or more of (meth)acrylic acid are used preferably in the present invention. According to the present invention, the polyol has a basic structure selected from the group consisting of a saturated or unsaturated aliphatic hydrocarbon, an aromatic hydrocarbon, a heterocyclic hydrocarbon, a primary, secondary, or tertiary amine, an ether, and which has two or more hydroxyl groups as substituents. The polyols of the present invention may further include one or more additional substituent(s), such as carboxyl group, carbonyl group, amino group, ether bond, thiol group, and thioether bond, as long as they do not impair the effect of the present invention.

Preferred examples of the polyol compound include: alkyl polyols, aryl polyols, polyalkanol amines, cyanuric acid, and dipentaerythritol. If the polyol compound has three or more hydroxyl groups, it is unnecessary for all the hydroxyl groups to react with (meth)acrylic acids and hence the compound may be partly esterified. In other words, the ester may have unreacted hydroxyl groups. Examples of that ester include: tris(2-acryloxyethyl) isocyanate, dipentaerythritol hexa(meth)acrylate, tripentaerythritol octa(meth)acrylate, pentaerythritol tetra(meth)acrylate, dipropyleneglycol diacrylate, tripropyleneglycol diacrylate, trimethylolpropane triacrylate, polytetramethyleneglycol dimethacrylate, trimethylolpropane trimethacrylate, ditrimethylolpropane tetraacrylate, tricyclodecanedimethanol diacrylate, 1,9-nonanediol diacrylate, 1,6-hexanediol diacrylate, and 1,10-decanediol diacrylate. Among the above, tris(2-acryloxyethyl) isocyanate and dipentaerythritol hexaacrylate are preferred in view of the reactivity and the number of crosslinkable groups. Those compounds may be used in combination of two or more thereof so as to control the shape of the formed pattern. For example, it is possible to adopt a compound having three (meth)acryloyloxy groups in combination with one having two (meth)acryloyloxy groups.

In view of the reactivity, the above compound is preferably a molecule having a molecular weight of preferably 2000 or less, more preferably 1500 or less. As publicly available functional acrylates, preferably bifunctional acrylates, multifunctional acrylates such as A-DOD, A-DCP, and/or A-9300 (from Shin-Nakamura Chemical Co., Ltd.) may be used singly or in mixture. In a further preferred embodiment of the present invention, the amount of the chemical compound that comprises two or more of (meth)acryloyl groups is in the range from 0.001 to 90 weight parts based on 100 weight parts of the (meth)acrylic polymer, more preferably 3 to 60 weight parts to realize better solubility with other polymers used in the composition of the present invention. Even more preferably, it is in the range from 5 to 50 weight parts based on 100 weight parts of the (meth)acrylic polymer.

Scattering Particles and/or Reflective Index Adjusting Materials

According to an embodiment of the present invention, the composition may further comprise additives selected from scattering particles, reflective index adjusting material and a combination of any of these.

According to the present invention, as the light scattering particles, any type of publicly known light scattering particles having different refractive index from the matrix material of the layer which includes said light scattering particles and can give Mie scattering effects, may be used preferably as desired.

For examples, small particles of inorganic oxides such as $SiO_2$, $SnO_2$, CuO, CoO, $Al_2O_3$, $TiO_2$, $Fe_2O_3$, $Y_2O_3$, ZnO, MgO; organic particles such as polymerized polystyrene, polymerized PMMA; inorganic hollow oxides such as hollow silica or a combination of any of these; may be preferably used. The aforementioned light scattering particles may be used as the index adjusting material.

Preferably, the average particle diameter of the light scattering particles and or the reflective index adjusting material is in the range from 350 nm to 5 μm. More preferably, from 500 nm to 2 μm.

Without wishing to be bound by theory, it is believed that more than 350 nm average particle diameter may lead to strong forward scattering caused by Mie scattering in a later, even if the refractive index difference between the light scattering particles and the layer matrix is as small as 0.1. On the other hand, to obtain better layer forming properties by using the light scattering particles, the maximum average particle diameter is preferably 5 μm.

Coloring Agent

Further, according to necessity, a colorant can be incorporated into the composition of the present invention. Various known organic and inorganic colorants are employable, but inorganic colorants are preferred in view of the heat resistance. Examples thereof include carbon black, titanium black pigment, iron oxide pigment, and composite metal oxide pigment.

The amount of the colorant is preferably 0.1 to 50 weight parts based on 100 weight parts in total of the (meth)acrylic polymer. If it is less than 0.1 weight part, sufficient light-shielding effect cannot be obtained. On the other hand, if it is more than 50 weight parts, light-shielding effect may be so large that the photosensitive material cannot be exposed enough to obtain a pattern.

Other Additives

The composition of the present invention may contain other additives, if necessary. Examples of the additives include developer-dissolution promoter, scum remover, adhesion enhancer, polymerization inhibitor, defoaming agent, surfactant and sensitizer.

The developer-dissolution promoter or the scum remover has a function of controlling solubility of the formed coating in a developer and thereby of preventing scum from remaining on the substrate after development. As this additive, crown ethers can be adopted. Crown ethers having the simplest structures are represented by the general formula: $(-CH_2-CH_2-O-)_n$. Among them, crown ethers of the formula in which n is 4 to 7 are preferably used in the present invention. Meanwhile, crown ethers are often individually referred to as "x-crown-y-ether" in which x and y represent the total number of atoms forming the ring and the number of oxygen atoms included therein, respectively. In the present invention, the additive can be preferably selected from the group consisting of crown ethers of X=12, 15, 18 and 21 and y=x/3, benzo-condensed products thereof, and cyclohexyl-condensed products thereof. Preferred examples of the crown ethers include 2-crown-7-ether, 18-crown-6-ether, 15-crown-5-ether, 12-crown-4-ether, dibenzo-21-crown-7-ether, dibenzo-18-crown-6-ether, dibenzo-15-crown-5-ether, dibenzo-12-crown-4-ether, dicyclohexyl-21-crown-7-ether, dicyclohexyl-18-crown-6-ether, dicyclohexyl-5-crown-5-ether, and dicyclohexyl-12-crown-4-ether. Among them, it is particularly preferred to select the additive from the group consisting of 18-crown-6-ether and 15-crown-5-ether. The amount thereof is preferably 0.05 to 15 weight parts, more preferably 0.1 to 10 weight parts, based on 100 weight parts of the (meth)acrylic polymer.

The adhesion enhancer has a function of preventing the pattern from being peeled off by stress applied after curing when a cured film is formed from the photosensitive composition of the present invention. As the adhesion enhancer, imidazoles and silane coupling agents are preferably adopted. Examples of the imidazoles include 2-hydroxybenzimidazole, 2-hydroxyethylbenzimidazole, benzimidazole, 2-hydroxyimidazole, imidazole, 2-mercaptoimidazole, and 2-aminoimidazole. Among them, particularly preferred are 2-hydroxybenzimidazole, benzimidazole, 2-hydroxyimidazole and imidazole.

As the silane coupling agents, known compounds, such as, epoxy-silane coupling agents, amino-silane coupling agents and mercapto-silane coupling agents, can be preferably adopted. Examples thereof include 3-glycidoxypropyltrimethoxysilane, 3-glycidoxypropyltriethoxysilane, N-2-(aminoethyl)-3-aminopropyltrimethoxysilane, N-2-(aminoethyl)-3-aminopropyltriethoxysilane, 3-aminopropyltrimethoxysilane, 3-amino-propyltriethoxysilane, 3-ureidopropyltrimethoxysilane, 3-chloropropyltrimethoxysilane, 3-mercaptopropyltrimethoxysilane, and 3-isocyanatepropyltrimethoxysilane. Those can be used singly or in combination of two or more. The amount thereof is preferably 0.05 to 15 weight parts based on 100 weight parts of the (meth)acrylic polymer. Further compounds employable as the silane coupling agent, in particular silane or siloxane compound having an acidic group, are disclosed in WO 2017/054898 A1.

As the polymerization inhibitor, nitrone derivatives, nitroxide radical derivatives and hydroquinone derivatives, such as, hydroquinone, methylhydroquinone and butyllhydroquinine, can be incorporated. Those can be used singly or in combination of two or more. The amount thereof is preferably 0.1 to 10 weight parts based on 100 weight parts of the (meth)acrylic polymer.

Examples of the defoaming agent include: alcohols ($C_1$ to $C_{18}$); higher fatty acids, such as, oleic acid and stearic acid; higher fatty acid esters, such as, glycerin monolaurate; polyethers, such as, polyethylenglycol (PEG) (Mn: 200 to 10000) and polypropyleneglycol (Mn: 200 to 10000); silicone compounds, such as, dimethyl silicone oil, alkyl-modified silicone oil and fluoro-silicone oil; and organic siloxane surfactants described below in detail. Those can be used singly or in combination of two or more. The amount thereof is preferably 0.1 to 3 weight parts based on 100 weight parts of the (meth)acrylic polymer.

If necessary, the photosensitive composition of the present invention can further contain a surfactant, which is incorporated with the aim of improving coatability, developability and the like. The surfactants usable in the present invention are, for example, nonionic, anionic and amphoteric surfactants. Examples of the nonionic surfactants include: polyoxyethylene alkyl ethers, such as, polyoxyethylene lauryl ether, polyoxyethylene oleyl ether and polyoxyethylene cetyl ether; polyoxyethylene fatty acid diethers; polyoxyethylene fatty acid monoethers; polyoxyethylene-polyoxypropylene block polymer; acetylene alcohol; acetylene glycol derivatives, such as, acetylene glycol, polyethoxyate of acetylene alcohol, and polyethoxyate of acetylene glycol; silicon-containing surfactants, such as, Fluorad ([trademark], manufactured by Sumitomo 3M Limited), MEGAFAC ([trademark], manufactured by DIC Corporation), and Surufuron ([trademark], manufactured by Asahi Glass Co., Ltd.); and organic siloxane surfactants, such as, KP341 ([trademark], manufactured by Shin-Etsu Chemical Co., Ltd.). Examples of the above acetylene glycols include: 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, and 2,5-dimethyl-2,5-hexanediol.

Examples of the anionic surfactants include: ammonium salts and organic amine salts of alkyldiphenylether disulfonic acids, ammonium salts and organic amine salts of alkyldiphenylether sulfonic acids, ammonium salts and organic amine salts of alkylbenzenesulfonic acids, ammonium salts and organic amine salts of polyoxyethylenealkylether sulfuric acids, and ammonium salts and organic amine salts of alkylsulfuric acids. Further, examples of the amphoteric surfactants include 2-alkyl-N-carboxymethyl-N-hydroxyethyl imidazolium betaine, and laurylic acid amidopropyl hydroxy sulfone betaine.

Those surfactants can be used singly or in combination of two or more. The amount thereof is normally 50 to 300000 ppm, preferably 100 to 200000 ppm, based on the photosensitive composition of the present invention. According to necessity, a sensitizer can further be incorporated into the photosensitive composition of the present invention. Examples of the sensitizer preferably used in the composition of the present invention include Coumarin, ketocoumarin, derivatives thereof, thiopyrylium salts, and acetophenone. Specifically, concrete examples thereof include: sensitizing dyes, such as, p-bis(o-methylstryl)benzene, 7-dimethylamino-4-methylquinolone-2,7-amino-4-methylcoumarin, 4,6-dimethyl-7-ethylaminocoumarin, 2-(p-dimethylaminostryl)pyridylmethyl iodide, 7-diethylaminocoumarin, 7-diethylamino-4-methylcoumarin, 2,3,5,6-1H,4H-tetrahydro-8-methylquinolidino-<9,9a,1-gh>coumarin, 7-diethylamino-4-trifluoromethylcoumarin, 7-dimethylamino-4-trifluoromethylcoumarin, 7-amino-4-trifluoromethylcoumarin, 2,3,5,6-1H,4H-tetrahydroquinolidino-<9,9a,1-gh>Coumarin, 7-ethylamino-6-methyl-4-trifluoromethylcoumarin, 7-ethylamino-4-trifluoromethylcoumarin, 2,3,5,6-1H,4H-tetrahydro-9-carboethoxyquinolidino-<9,9a,1-gh>coumarin, 3-(2'-N-methyl-benzimidazolyl)-7-N,N-diethylarninocoumarin, N-methyl-4-trifluoromethylpiperidino-<3,2-g>Coumarin, 2-(p-dimethylaminostryl)benzo-thiazolylethyl iodide, 3-(2'-benzimidazolyl)-7-N,N-diethylaminocournarin, 3-(2'-benzothiazolyI)-7-N,N-diethylaminocoumarin, and pyrylium or thiopyrylium salts represented by the following formula.

The sensitizing dye makes it possible to carry out patterning by use of inexpensive light sources, such as, a high-pressure mercury lamp (360 to 430 nm). The amount thereof is preferably 0.05 to 15 weight parts, more preferably 0.1 to 10 weight parts based on 100 weight parts of the (meth)acrylic polymer.

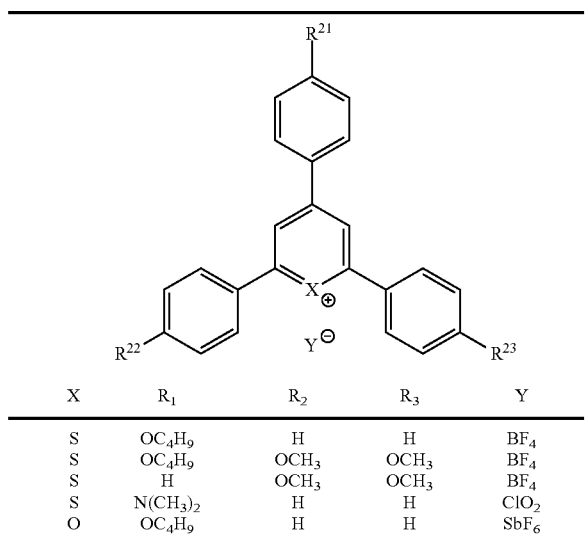

| X | $R_1$ | $R_2$ | $R_3$ | Y |
|---|---|---|---|---|
| S | $OC_4H_9$ | H | H | $BF_4$ |
| S | $OC_4H_9$ | $OCH_3$ | $OCH_3$ | $BF_4$ |
| S | H | $OCH_3$ | $OCH_3$ | $BF_4$ |
| S | $N(CH_3)_2$ | H | H | $ClO_2$ |
| O | $OC_4H_9$ | H | H | $SbF_6$ |

As the sensitizer, it is also possible to adopt a compound having an anthracene skeleton as disclosed, for example, in WO 2012/059931 A1 or JP 3820633 B. When the sensitizer having an anthracene skeleton is added, the amount thereof is preferably 0.01 to 5 weight parts based on 100 weight parts of the (meth)acrylic polymer.

Further, if necessary, a stabilizer can be also added into the composition of the present invention. The stabilizer can be freely selected from those generally known. However, in the present invention, aromatic amines are preferred because they have high effect on stabilization. Among those aromatic amines, preferred are pyridine derivatives and particularly preferred are pyridine derivatives having bulky substituent groups at 2- and 6-positions. Concrete examples thereof are as follows:

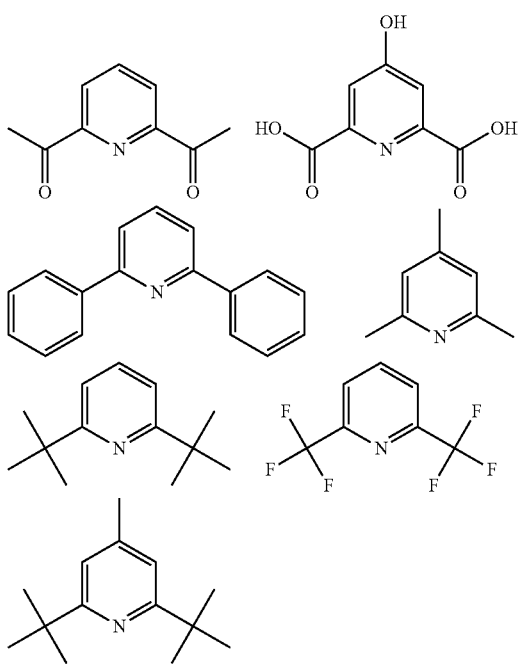

Further, according to necessity, a crosslinking agent can be incorporated into the composition of the present invention. Examples of the crosslinking agent include melamine or isocyanate compounds having methylol or alkoxylmethyl groups. Concrete examples of the melamine compounds include: NIKAKAC NW-390, NW-100LM, MX-750LM, MX-270, and MX-280, which have imino, methylol or methoxy methyl groups.

Concrete examples of the isocyanate compounds include: X-12-9659 or KBM-9659, and X-12-9659 or KBM-585 ([trademark], manufactured by Shin-Etsu Chemical Co., Ltd.). Also preferred are polymers including those structures, which may be partly substituted with silicone groups.

The amount of the crosslinking agent is 0 to 50 weight parts, preferably 2 to 50 weight parts, more preferably 5 to 20 weight parts based on 100 weight parts of the (meth) acrylic polymer. If it is 5 weight parts or more, the resolution can be sufficiently improved. On the other hand, if it is 50 weight parts or less, there is little fear that gaps in the pattern are buried to lower the resolution. As the crosslinking agent, the above compounds can be used singly or in mixture of two or more.

The photosensitive composition according to the present invention, which comprises at least one nanosized light emitting material and the (meth)acrylic polymer comprising at least one (meth)acrylic structural unit including an acryloyl group as defined herein, and preferably the oxime ester-type photo-initiator, the dispersing or wetting agent and the chemical compound including two or more of (meth)acryloyl groups, can advantageously achieve highly cross-linked film fabrication even at low UV exposure doses acceptable for mass production processes, and high-resolution patterning using conventional photo-lithography techniques. Without being bound by any theory, it is believed that the as defined photosensitive composition according to the present invention can induce effective radical carriage to achieve polymerization even in depth.

Therefore, even by low UV exposure dose sufficient polymerization can be achieved. Due to the low UV doses, the quantum materials in quantum material doped films can advantageously maintain high quantum yield in an optical medium. Furthermore, the photosensitive composition according to the present invention advantageously allows formation of a highly cross-linked polymer surface, thereby increasing solvent durability of the cured film, particularly when an overcoat material is applied to the film, and chemical resistance.

Use

One or more of the objects of the present invention are also solved by the use of the (meth)acrylic polymer as defined herein, which comprises at least one (meth)acrylic structural unit including an acryloyl group as represented by the chemical formula (1), in a composition that comprises at least one nanosized light emitting material, preferably said composition is a photosensitive composition.

The nanosized light emitting material comprised in such photosensitive composition may be as defined herein.

The photosensitive composition may further comprise one or more of a photo-polymerization initiator, a wetting or dispersing agent, a solvent, a chemical compound including two or more of (meth)acryloyl groups scattering particles and a reflective index adjusting material, each of which compound is as defined herein.

The (meth)acrylic polymer may further comprises one or more (meth)acrylic structural units selected from the chemical formulae (2), (3) and (4) as defined herein.

The present invention also relates to the use of the photosensitive composition comprising at least one nanosized light emitting material and a (meth)acrylic polymer as defined herein, in a process for manufacturing an optical medium.

The optical medium according to the present invention is preferably an optical film, such as a color filter, a color conversion film, a remote phosphor tape, or another film or filter. According to the present invention, the term "film" includes "layer" and "sheet" like structures.

Manufacturing Methods

The present invention furthermore relates to a method for preparing an optical medium, wherein the method comprises the following steps a) and b) in this sequence:
a) providing the photosensitive composition onto a substrate, and
b) polymerizing the photosensitive composition by exposing the photosensitive composition under radiation.

According to the present invention, to provide the photosensitive composition onto the substrate according to step a), any type of publicly known coating method can be used preferably. For examples, immersion coating, gravure coating, roll coating, bar coating, brush coating, spray coating, doctor coating, flow coating, spin coating, and slit coating.

The substrate to be coated with the composition in step a) is also not particularly limited, and can be properly selected from, for example, a silicon substrate, a glass substrate and a polymer or resin film. The substrate may be solid or flexible, and transparent or not transparent.

In a preferred embodiment of the present invention, optionally, after step a) a prebaking (preheating treatment) step can be applied to the photosensitive composition provided onto the substrate for the purposes of drying and of reducing the solvent remaining therein. The prebaking step can be carried out at a temperature of generally 50 to 150° C., preferably 90 to 120° C., for 10 to 300 seconds, preferably 30 to 120 seconds on a hotplate or for 1 to 30 minutes in a clean oven. Further, according to necessity, the step of providing the photosensitive composition onto the substrate may be repeatedly carried out once or twice or more so as to form a coating or film of desired thickness.

After the coating is formed, the surface thereof is exposed to radiation. As a source of radiation for the exposure, it is possible to adopt any light source used in conventional pattern-formation processes. Examples of the light source include high-pressure mercury lamp, low-pressure mercury lamp, metal halide lamp, xenon lamp, laser diode and LED. Light for the exposure is normally UV rays of g-line, h-line, i-line, or the like. Except for in the case of ultrafine fabrication of semiconductors and the like, it is common to use light of 360 to 430 nm wavelength (high-pressure mercury lamp) for patterning in several micrometers to several tens of micrometers.

Particularly in producing a liquid crystal display, light of 430 nm is often used. Energy of the exposure radiation depends on the source of radiation and the thickness of the coating, but is generally 10 to 2000 $mJ/cm^2$, preferably 20 to 1000 $mJ/cm^2$, in order to obtain satisfying resolution and to avoid halation.

According to the present method, there are no particular restrictions on the environmental conditions in the exposure, and the exposure can be carried out under an ambient atmosphere (the normal atmosphere) or under a nitrogen atmosphere. If a film is to be formed on the whole surface of the substrate, the whole substrate surface is exposed to radiation. In the present invention, the term "pattern film" includes a film thus formed on the whole surface of the substrate.

After the exposing step b), optionally, post-exposure baking can be carried out according to necessity with the aim of promoting interpolymer reactions caused by the reaction initiator in the exposed area of the coating. The temperature of the post-exposure baking is preferably 40 to 150° C., more preferably 60 to 120° C. The post-exposure baking step can be carried out using a hot-plate, an oven, a furnace or the like. There are no particular restrictions on the atmosphere during baking. In order to control the curing speed of the composition, the atmosphere can be selected from, for example, an atmosphere of inert gas such as nitrogen gas, a vacuum atmosphere, a reduced-pressure atmosphere, an oxygen gas atmosphere and the like. The baking time is preferably 20 to 500 seconds, more preferably 40 to 300 seconds, so as to keep higher uniformity of thermal budget in the wafer surface but also to prevent the diffusion of acid.

After the exposing step b), a step c) of developing the polymerized composition, preferably the photosensitive composition, may optionally be carried out. If a film is to be formed on the whole surface of the substrate, development step c) can be omitted. As a developer used in the development step, it is possible to adopt any developer employed in developing conventional photosensitive compositions. In the present invention, TMAH aqueous solutions are used to determine the dissolution rate of the photosensitive composition but they by no means restrict the developer for forming a cured film. Preferred examples of the developer include alkali developers which are aqueous solutions of alkaline compounds, such as, tetraalkylammonium hydroxide, choline, alkali metal hydroxides, alkali metal (meta) silicates (hydrate), alkali metal (meta)phosphates (hydrate), ammonia, alkylamines, alkanolamines, and heterocyclic amines. Particularly preferred is an aqueous solution of tetraalkylammonium hydroxide. Those alkali developers may contain water-soluble organic solvents, such as, methanol and ethanol, or surfactants, if necessary. The developing method can be freely selected from known methods, such as, dip, paddle, shower, slit, cap coat and spray development processes. As a result of the development, a pattern can be obtained. After being developed with a developer, the pattern is preferably washed with water. An acetone washing process after the development step can be optionally added.

After the development step, the obtained pattern film may optionally be heated and thereby cured. The heating apparatus used in the heating step can be the same as that used in the post-exposure baking step. The heating temperature in this heating step is not particularly restricted as long as the film can be cured. Specifically, the composition is preferably cured at a temperature of 360° C. or less. In order to leave the cured film in a high remaining film ratio, the heating temperature is more preferably 300° C. or less, further preferably 250° C. or less. On the other hand, in order to promote the curing reaction and to obtain a sufficiently cured film, the temperature is preferably 70° C. or more, further preferably 100° C. or more, particularly preferably 110° C. or more. The heating time is also not particularly restricted, but is generally 10 minutes to 24 hours, preferably 30 minutes to 3 hours. Here, the "heating time" means a period of time from when the temperature of the pattern film is elevated to reach the aimed heating temperature. It normally takes several minutes to several hours to heat the pattern film from the initial temperature up to the aimed heating temperature.

The optical medium thus obtained, which may be an optical film, such as a color filter, a color conversion film, a remote phosphor tape, or another film or filter, has increased chemical resistance and solvent durability and can achieve fine patterning, high quantum yield and high OD.

Therefore, the present invention also relates to an optical medium obtained or obtainable by the present method.

Furthermore, the present invention relates to an optical medium formed from the composition, preferably from the photosensitive composition, as defined herein.

The optical medium according to the present invention can advantageously be used in various applications. For example, it can be favorably employed as a material for optical elements, such as optical waveguides, as well as a material for various films, such as planarization films on thin-film transistor (TFT) substrates, which are used as backplanes of displays such as LCD devices or organic EL devices; interlayer insulating films in semiconductor devices; and other insulating films or transparent protective films of solid state image sensors, of antireflection panels or films, of optical filters, of high brightness LED devices, of touch panels, and of solar cells. Therefore, the present invention also relates to the use of the optical medium in an optical device.

The present invention furthermore relates to an optical device comprising the optical medium.

The optical device of the present invention is preferably a liquid crystal display, an electro-luminescent display, a Micro Electro Mechanical System (MEMS) display, an electro wetting display, and an electrophoretic display. More preferably, the optical device is a liquid crystal display, such as a twisted nematic liquid crystal display, a vertical alignment mode liquid crystal display, an IPS mode liquid crystal display, a guest host mode liquid crystal display, or a normally black TN mode liquid crystal display. Examples of optical devices have been described in, for example, WO 2010/095140 A2 and WO 2012/059931 A1.

The present invention furthermore relates to a method for preparing the optical device, wherein the method comprises following step A): A) providing the optical medium in an optical device.

Technical Effects

The present invention provides one or more of following effects; Improved polymerization with lower UV irradiation intensity, fine patterning, improved resolution of a photo-pattern of the composition, improved solvent damage stability of pattern when an overcoat material is applied onto the pattern, improved photo luminescent of light emitted from the light emitting material(s) after patterning, improved quantum yield of the light emitting materials(s) after patterning and/or after overcoat material is fabricated onto the pattern, improved solvent stability, improved cross-linking density of the composition after UV irradiation.

The invention is described in more detail in reference to the following examples, which are only illustrative and do not limit the scope of the invention.

WORKING EXAMPLES

Working Example 1 Preparation of Photosensitive Composition 1

A solution of 4.32 g of a UV reactive polymer which disperses in t-butanol and propylene glycol monomethyl ether acetate (PGMEA) at 40 wt. % (RNUV-071, obtained from Natoco Co., Ltd.) is mixed with 1.976 g of hexa-functional acrylic monomer (A-DPH, obtained from Shin-Nakamura Chem.) and 0.297 g of oxime ester type photo-initiator (Irgacure OXE03 obtained from BASF). After that, 4.408 g of PGMEA is added to the mixture, and this mixture is stirred by a magnetic stirrer at room temperature for 30 minutes to get a UV reactive photosensitive polymer mixture.

A solution of 0.5 g of InP based red quantum material in $CHCl_3$ is added dropwise to a solution of 0.53 g of dispersing agent (BYK-LPN22822) in $CHCl_3$. This mixture is first stirred by a magnetic stirrer at 60° C. for 18 hours, then at 80° C. for 2 hours under nitrogen atmosphere. After that, 1.428 g of PGMEA is added to this mixture and $CHCl_3$ is evaporated using a rotary evaporator.

The thus obtained solution including 667 mg of the red quantum material is then mixed with the solution including 500 mg of the UV reactive photosensitive polymer mixture.

Comparative Example 1 Preparation of Photosensitive Composition 2

A solution of 19.25 g of an acrylic polymer which disperses in n-butanol and PGMEA at 40 wt. % (AZHT-003, obtained from Natoco Co., Ltd.) and 19.25 g of an acrylic polymer which disperses in n-butanol and PGMEA at 40 wt. % (AZHT-002, obtained from Natoco Co., Ltd.) is mixed with 7.75 g of bi-functional acrylic monomer (A-DCP, obtained from Shin-Nakamura Chem.), 7.75 g of bi-functional acrylic monomer (A-DOD-N, obtained from Shin-Nakamura Chem.), 24.7 g of hexa-functional monomer (A-DPH, obtained from Shin-Nakamura Chem.) and 3.7 g of oxime ester-type photo-initiator (Irgacure OXE03 obtained from BASF). This polymer mixture is stirred by a magnetic stirrer at room temperature for 30 minutes.

A solution of 0.5 g of InP based red quantum materials in $CHCl_3$ is added dropwise to a solution of 0.53 g of a dispersing agent (BYK-LPN22822) in $CHCl_3$. This mixture is first stirred by a magnetic stirrer at 60° C. for 18 hours, then at 80° C. for 2 hours under nitrogen atmosphere. After that, 1.428 g of PGMEA is added to this mixture and $CHCl_3$ is evaporated using a rotary evaporator.

The thus obtained solution including 500 mg of the red quantum material is mixed with the solution of 500 mg of the polymer mixture.

Working Example 2 Fabrication of Patterned Films

A glass substrate is cleaned by sonicating in water with detergent. Then the UV reactive solution of photosensitive composition 1 is coated onto the cleaned glass substrate using bar coating technique. The resulting film coated substrate is heated at 100° C. for 90 seconds at air condition to evaporate the solvent.

After the baking, the photosensitive composite film coated on the substrate is exposed to 3.9 $mW/cm^2$ of i, g, h lines light emission (80 $mJ/cm^2$, MA-10 produced by Mikasa) for 21 seconds.

Afterwards, the photosensitive composite film coated on the substrate is exposed to tetramethylammonium hydroxide (TMAH) for 30 seconds and rinsed with flowing water for 10 seconds at room temperature, then heated at 100° C. for 90 seconds on a hot plate to evaporate the water.

On the same way and under the same conditions, a patterned film is fabricated using photosensitive composition 2 of comparative example 1.

Working Example 3 Solvent Durability Test

PGMEA is coated on each cured resist film obtained in working example 2 by spin coating technique at 150 rpm for 10 seconds, and the PGMEA coated film is left as it is for 3 minutes. After that, the film is heated at 90° C. for 90 seconds on the hot plate.

The measurement results of the solvent durability test done by using an optical microscope equipped with a camera.

Result A is about an appearance image of the quantum material doped resist film obtained in working example 2 using UV reactive photosensitive composition 1 after the solvent durability test.

Result B is about an appearance image of the quantum material doped resist film obtained in working example 2 using photosensitive composition 2 after the solvent durability test (reference).

The photoresist composite film obtained using the photosensitive composition including the UV reactive photosensitive (meth)acrylic polymer as defined herein keeps solid and smooth surface (Result A). On the other hand, photoresist composite film obtained using the photosensitive composition without UV reactive polymer shows wrinkles (Result B).

The invention claimed is:

1. A composition comprising at least one nanosized light emitting material and a (meth)acrylic polymer, wherein the (meth)acrylic polymer comprises at least one (meth)acrylic structural unit represented by the following chemical formula (1):

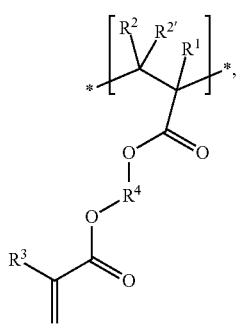

formula (1)

in which:

R[1] denotes, identically or differently at each occurrence, hydrogen, a straight-chain alkyl group having 1 to 20 C atoms, a branched or cyclic alkyl group having 3 to 20 C atoms, an alkenyl or alkynyl group having 2 to 20 C atoms, an aryl or heteroaryl group having 5 to 24 C atoms, where one or more non-adjacent methylene structural units (—CH$_2$—) in said alkyl, alkenyl, alkynyl, aryl or heteroaryl groups may in each case be replaced by a sulfonyl group, a carbonyl group, an ether group, a sulfide group, a sulfoxide group, an ester group, an amide group or an imine group, and wherein said alkyl, alkenyl, alkynyl, aryl or heteroaryl groups one or more H atoms may be replaced by F, Cl, Br, I, CN or OH, a carboxyl group (—COOH), a straight-chain alkyl or alkoxy group having 2 to 20 C atoms, a branched alkyl or alkoxy group having 3 to 20 C atoms, or an alkenyl or alkynyl group having 2 to 20 C atoms;

R[2], R[2'] denote, identically or differently at each occurrence, hydrogen, a hydroxyl group (—OH) a carboxyl group (—COOH), a straight-chain alkyl group having 1 to 20 C atoms, a branched or cyclic alkyl group having 3 to 20 C atoms, an alkenyl or alkynyl group having 2 to 20 C atoms, an aryl or heteroaryl group having 5 to 24 C atoms, where one or more non-adjacent methylene structural units (—CH$_2$—) in said alkyl, alkenyl, alkynyl, aryl or heteroaryl groups may in each case be replaced by a sulfonyl group, a carbonyl group, an ether group, a sulfide group, a sulfoxide group, an ester group, an amide group or an imine group, and wherein said alkyl, alkenyl, alkynyl, aryl or heteroaryl groups one or more H atoms may be replaced by F, Cl, Br, I, CN or OH, a carboxyl group (—COOH), a straight-chain alkyl or alkoxy group having 2 to 20 C atoms, a branched alkyl or alkoxy group having 3 to 20 C atoms, or an alkenyl or alkynyl group having 2 to 20 C atoms, with the proviso that both radicals R[2] and R[2'] bonded to the same C atom can denote carboxyl groups at the same time;

R[3] denotes, identically or differently at each occurrence, hydrogen, a straight-chain alkyl group having 1 to 20 C atoms, a branched or cyclic alkyl group having 3 to 20 C atoms, an alkenyl or alkynyl group having 2 to 20 C atoms, an aryl or heteroaryl group having 5 to 24 C atoms, where one or more non-adjacent methylene structural units (—CH$_2$—) in said alkyl, alkenyl, alkynyl, aryl or heteroaryl groups may in each case be replaced by a sulfonyl group, a carbonyl group, an ether group, a sulfide group, a sulfoxide group, an ester group, an amide group or an imine group, and wherein said alkyl, alkenyl, alkynyl, aryl or heteroaryl groups one or more H atoms may be replaced by F, Cl, Br, I, CN or OH, a carboxyl group (—COOH), a straight-chain alkyl or alkoxy group having 2 to 20 C atoms, a branched alkyl or alkoxy group having 3 to 20 C atoms, or an alkenyl or alkynyl group having 2 to 20 C atoms;

R[4] denotes, identically or differently at each occurrence, a straight-chain alkylene group having 1 to 20 C atoms, a branched alkylene group having 2 to 20 C atoms, an alkenylene or alkynylene group having 2 to 20 C atoms, or an arylene or heteroarylene group having 6 to 24 C atoms, where one or more methylene structural units (—CH$_2$—) in said alkylene, alkenylene, alkynylene, arylene or heteroarylene groups may in each case be replaced by a sulfonyl group, a carbonyl group, an ether group, a sulfide group, a sulfoxide group, an ester group, an amide group, an imine group, a group CHR' or a group CR'R";

R', R" denote, identically or differently at each occurrence, a hydroxyl group, a straight-chain alkyl group having 1 to 20 C atoms, a branched or cyclic alkyl group having 3 to 20 C atoms, an alkenyl or alkynyl group having 2 to 20 C atoms, an aryl or heteroaryl group having 5 to 24 C atoms, where one or more non-adjacent methylene structural units (—CH$_2$—) in said alkyl, alkenyl, alkynyl, aryl or heteroaryl groups may in each case be replaced by a sulfonyl group, a carbonyl group, an ether group, a sulfide group, a sulfoxide group, an ester group, an amide group or an imine group, and wherein said alkyl, alkenyl, alkynyl, aryl or heteroaryl groups one or more H atoms may be replaced by F, Cl, Br, I, CN or OH, a straight-chain alkyl or alkoxy group having 2 to 20 C atoms, a branched alkyl or alkoxy group having 3 to 20 C atoms, or an alkenyl or alkynyl group having 2 to 20 C atoms.

2. The composition according to claim 1, wherein

R[1] denotes hydrogen, a straight-chain alkyl group having 1 to 10 C atoms, or a branched alkyl group having 3 to 10 C atoms; and/or R[2'] denotes hydrogen or a methyl group and R[2] denotes hydrogen, a carboxyl group, a straight-chain alkyl group having 1 to 8 C atoms, wherein one or more H atoms may be replaced by F, Cl, OH, or a carboxyl group (—COOH); and/or R[3] denotes hydrogen, a straight-chain alkyl group having 1 to 10 C atoms, or a branched alkyl group having 3 to 10 C atoms; and/or R[4] denotes a straight-chain alkylene group having 1 to 10 C atoms, a branched alkylene group having 2 to 10 C atoms, an alkenylene group having 2 to 10 C atoms, or an arylene group having 6 to 10 C atoms, where one or more non-adjacent methylene structural units (—CH$_2$—) in said alkylene alkenylene or arylene groups may be replaced by a sulfonyl group, a carbonyl group, an ether group, a sulfide group, a sulfoxide group, an ester group, an amide group, an imine group, a group CHR' or a group CR'R".

3. The composition according to claim 1, wherein the (meth)acrylic polymer further comprises one or more (meth)acrylic structural units selected from the following chemical formulae (2), (3) and (4):

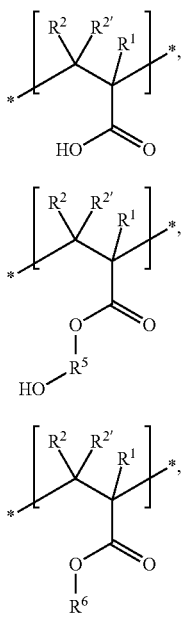

formula (2)

formula (3)

formula (4)

in which
radicals $R^1$, $R^2$ and $R^{2'}$ are at each occurrence, identically or differently, as defined in claim 1;
$R^5$ denotes, identically or differently at each occurrence, a straight-chain alkylene group having 1 to 20 C atoms, a branched alkylene group having 2 to 20 C atoms, an alkenylene or alkynylene group having 2 to 20 C atoms, or an arylene or heteroarylene group having 6 to 24 C atoms, where one or more methylene structural units (—CH$_2$—) in said alkylene, alkenylene, alkynylene, arylene or heteroarylene groups may in each case be replaced by a sulfonyl group, a carbonyl group, an ether group, a sulfide group, a sulfoxide group, an ester group, an amide group, an imine group, a group CHR' or a group CR'R", wherein radicals R' and R" are as defined above; and
$R^6$ denotes, identically or differently at each occurrence, a straight-chain alkyl group having 1 to 20 C atoms, a branched alkyl group having 3 to 20 C atoms, or a cyclic alkyl group having 3 to 20 C atoms.

4. The composition according to claim 3, wherein $R^5$ denotes a straight-chain alkylene group having 1 to 10 C atoms, a branched alkylene group having 2 to 10 C atoms, or an alkenylene group having 2 to 10 C atoms, where one or more non-adjacent methylene structural units (—CH$_2$—) in said alkylene or alkenylene groups may be replaced by a sulfonyl group, a carbonyl group, an ether group, a sulfide group, a sulfoxide group, an ester group, an amide group, an imine group, a group CHR' or a group CR'R", wherein radicals R' and R" are as defined above, and/or $R^6$ denotes a straight-chain alkyl group having 1 to 10 C atoms, a branched alkyl group having 3 to 10 C atoms, or a cyclic alkyl group having 6 C atoms.

5. The composition according to claim 1, wherein the weight average molecular weight of the (meth)acrylic polymer is in the range from 2000 to 100000.

6. The composition according to claim 1, wherein the equivalent amount of the (meth)acrylic structural unit including an acryloyl group in the (meth)acrylic polymer is in the range from 400 to 560.

7. The composition according to claim 1, wherein the composition further comprises a photo-polymerization initiator.

8. The composition according to claim 1, wherein the composition further comprises a dispersing and wetting agent.

9. The composition according to claim 1, wherein the composition further comprises a solvent.

10. The composition according to claim 1, wherein the composition further comprises additives selected from scattering particles, reflective index adjusting material and a combination of any of these.

11. The composition according to claim 1, wherein the composition further comprises a chemical compound including two or more of (meth)acryloyl groups.

12. The composition according to claim 1, wherein the composition further comprises a photo-polymerization initiator selected from azo compounds, peroxides, acyl phosphine oxides, alkyl phenones, oxime esters, and titanocenes.

13. An optical medium comprising a composition according to claim 1.

14. A method for preparing an optical medium, wherein the method comprises the following steps a) and b) in this sequence:
a) providing a composition according to claim 1 onto a substrate, and
b) polymerizing the composition by exposing the composition under radiation.

15. The method for preparing the optical medium according to claim 14, wherein the method further comprises step c) after step b):
c) developing the polymerized composition.

16. An optical medium obtained by a method according to claim 14.

17. An optical device comprising an optical medium according to claim 16.

18. A method comprising step A):
A) providing inserting an optical medium according to claim 16 into an optical device.

* * * * *